United States Patent
Shen et al.

(10) Patent No.: US 11,682,554 B2
(45) Date of Patent: Jun. 20, 2023

(54) CATALYTIC THERMAL DEPOSITION OF CARBON-CONTAINING MATERIALS

(71) Applicant: Applied Materials, Inc., Santa Clara, CA (US)

(72) Inventors: Zeqing Shen, San Jose, CA (US); Bo Qi, San Jose, CA (US); Abhijit Basu Mallick, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/235,241

(22) Filed: Apr. 20, 2021

(65) Prior Publication Data

US 2022/0336212 A1   Oct. 20, 2022

(51) Int. Cl.
*H01L 21/311* (2006.01)
*H01L 21/02* (2006.01)
*H01J 37/32* (2006.01)

(52) U.S. Cl.
CPC .. *H01L 21/02167* (2013.01); *H01J 37/32449* (2013.01); *H01L 21/02271* (2013.01); *H01L 21/31116* (2013.01); *H01J 37/32541* (2013.01); *H01J 37/32568* (2013.01); *H01J 37/32697* (2013.01); *H01J 37/32715* (2013.01); *H01J 2237/2007* (2013.01); *H01J 2237/20214* (2013.01); *H01J 2237/334* (2013.01)

(58) Field of Classification Search
CPC ............... H01L 21/31138; H01L 21/02299
See application file for complete search history.

(56) References Cited

U.S. PATENT DOCUMENTS

| | | | | |
|---|---|---|---|---|
| 5,403,434 A | * | 4/1995 | Moslehi | H01L 21/02049 134/1 |
| 2012/0321791 A1 | | 12/2012 | Suzuki et al. | |
| 2017/0365462 A1 | * | 12/2017 | Varadarajan | C23C 16/50 |
| 2018/0347035 A1 | * | 12/2018 | Weimer | H01L 21/76834 |
| 2020/0176249 A1 | | 6/2020 | Nakatani et al. | |
| 2020/0263295 A1 | | 8/2020 | Miyahara et al. | |

FOREIGN PATENT DOCUMENTS

JP   02228475 A   9/1990

OTHER PUBLICATIONS

Application No. PCT/US2022/025160, International Search Report and Written Opinion, dated Aug. 9, 2022, 11 pages.

* cited by examiner

*Primary Examiner* — Thomas T Pham
(74) *Attorney, Agent, or Firm* — Kilpatrick Townsend & Stockton LLP

(57) ABSTRACT

Exemplary methods of semiconductor processing may include providing a silicon-containing precursor and a carbon-containing precursor to a processing region of a semiconductor processing chamber. The carbon-containing precursor may be characterized by a carbon-carbon double bond or a carbon-carbon triple bond. A substrate may be disposed within the processing region of the semiconductor processing chamber. The methods may include providing a boron-containing precursor to the processing region of the semiconductor processing chamber. The methods may include thermally reacting the silicon-containing precursor, the carbon-containing precursor, and the boron-containing precursor at a temperature above about 250° C. The methods may include forming a silicon-and-carbon-containing layer on the substrate.

15 Claims, 3 Drawing Sheets

CATALYTIC THERMAL DEPOSITION OF CARBON-CONTAINING MATERIALS

TECHNICAL FIELD

The present technology relates to methods and components for semiconductor processing. More specifically, the present technology relates to systems and methods for producing carbon-containing films for semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, critical dimensions between features may reduce, and maintaining dimensions of these structures during processing operations may be challenged due to material roughness and other characteristics. Developing materials that may have sufficient conformality and stress characteristics across features may be a challenge. Additionally, as the number of material layers being patterned during processing is expanding, producing materials that may have improved removal selectivity to other exposed materials is becoming a greater challenge, along with maintaining material properties.

Thus, there is a need for improved systems and methods that can be used to produce high quality devices and structures. These and other needs are addressed by the present technology.

SUMMARY

Exemplary methods of semiconductor processing may include providing a silicon-containing precursor and a carbon-containing precursor to a processing region of a semiconductor processing chamber. The carbon-containing precursor may be characterized by a carbon-carbon double bond or a carbon-carbon triple bond. A substrate may be disposed within the processing region of the semiconductor processing chamber. The methods may include providing a boron-containing precursor to the processing region of the semiconductor processing chamber. The methods may include thermally reacting the silicon-containing precursor, the carbon-containing precursor, and the boron-containing precursor at a temperature above about 250° C. The methods may include forming a silicon-and-carbon-containing layer on the substrate.

In some embodiments, the processing region of the semiconductor processing chamber may be maintained plasma-free while forming the silicon-and-carbon-containing layer on the substrate. A boron concentration within the film may be maintained at less than or about 20 at. %. The substrate may be characterized by one or more features, and the silicon-and-carbon-containing layer may be formed about the one or more features with a conformality of greater than or about 90%. Thermally reacting the silicon-containing precursor, the carbon-containing precursor, and the boron-containing precursor may be performed at a temperature greater than or about 400° C. The silicon-and-carbon-containing layer may be characterized by a carbon concentration of greater than or about 30 at. %. the silicon-and-carbon-containing layer may be characterized by a silicon concentration of less than or about 50 at. %. A ratio of carbon incorporation to silicon incorporation may be maintained at greater than or about 3:1. The methods may include halting delivery of the silicon-containing precursor. The methods may include reducing a pressure within the semiconductor processing chamber. The methods may include maintaining delivery of the carbon-containing precursor while reducing the pressure within the semiconductor processing chamber. The carbon-containing precursor may be provided at a flow rate ratio to the silicon-containing precursor of greater than or about 10:1. The methods may include exposing the silicon-and-carbon-containing layer to an oxygen-containing plasma. The methods may include at least partially etching the silicon-and-carbon-containing layer.

Some embodiments of the present technology may encompass semiconductor processing methods. The methods may include providing a silicon-containing precursor and a carbon-containing precursor to a processing region of a semiconductor processing chamber. The carbon-containing precursor may be provided at a flow rate ratio to the silicon-containing precursor of greater than or about 10:1. A substrate may be disposed within the processing region of the semiconductor processing chamber. The methods may include providing a boron-containing precursor to the processing region of the semiconductor processing chamber. The methods may include thermally reacting the silicon-containing precursor, the carbon-containing precursor, and the boron-containing precursor at a temperature greater than or about 400° C. The methods may include forming a silicon-and-carbon-containing layer on the substrate.

In some embodiments, the processing region of the semiconductor processing chamber may be maintained plasma-free during the semiconductor processing method. A pressure within the semiconductor processing chamber may be maintained at greater than or about 12 Torr while forming the silicon-and-carbon-containing layer. The silicon-and-carbon-containing layer may be characterized by an average roughness of less than or about 0.5 nm. The silicon-and-carbon-containing layer may be characterized by a positive stress. The silicon-and-carbon-containing layer may be characterized by a carbon concentration of greater than or about 50 at. %. The silicon-and-carbon-containing layer may be characterized by a silicon concentration of less than or about 20 at. %. The silicon-and-carbon-containing layer may be characterized by a boron concentration of less than or about 10 at. %. The methods may include halting delivery of the silicon-containing precursor. The methods may include reducing a pressure within the semiconductor processing chamber. The methods may include maintaining delivery of the carbon-containing precursor while reducing the pressure within the semiconductor processing chamber.

Some embodiments of the present technology may encompass semiconductor processing methods. The methods may include providing a silicon-containing precursor, a first carbon-containing precursor, and a second carbon-containing precursor to a processing region of a semiconductor processing chamber. A substrate may be disposed within the processing region of the semiconductor processing chamber. The methods may include providing a catalytic precursor to the processing region of the semiconductor processing chamber. The methods may include thermally reacting the silicon-containing precursor, the first carbon-containing precursor, the second carbon-containing precursor, and the catalytic precursor at a temperature greater than or about 300° C. The methods may include forming a silicon-and-carbon-containing layer on the substrate.

In some embodiments, the processing region of the semiconductor processing chamber may be maintained plasma-free while forming the silicon-and-carbon-containing layer on the substrate. The methods may include halting delivery of the silicon-containing precursor. The methods may include reducing a pressure within the semiconductor processing chamber. The methods may include maintaining delivery of the carbon-containing precursor while reducing the pressure within the semiconductor processing chamber.

Such technology may provide numerous benefits over conventional systems and techniques. For example, embodiments of the present technology may produce carbon-containing materials characterized by an increased carbon concentration compared to conventional techniques. Additionally, the present technology may produce carbon-containing films with tunable film properties. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
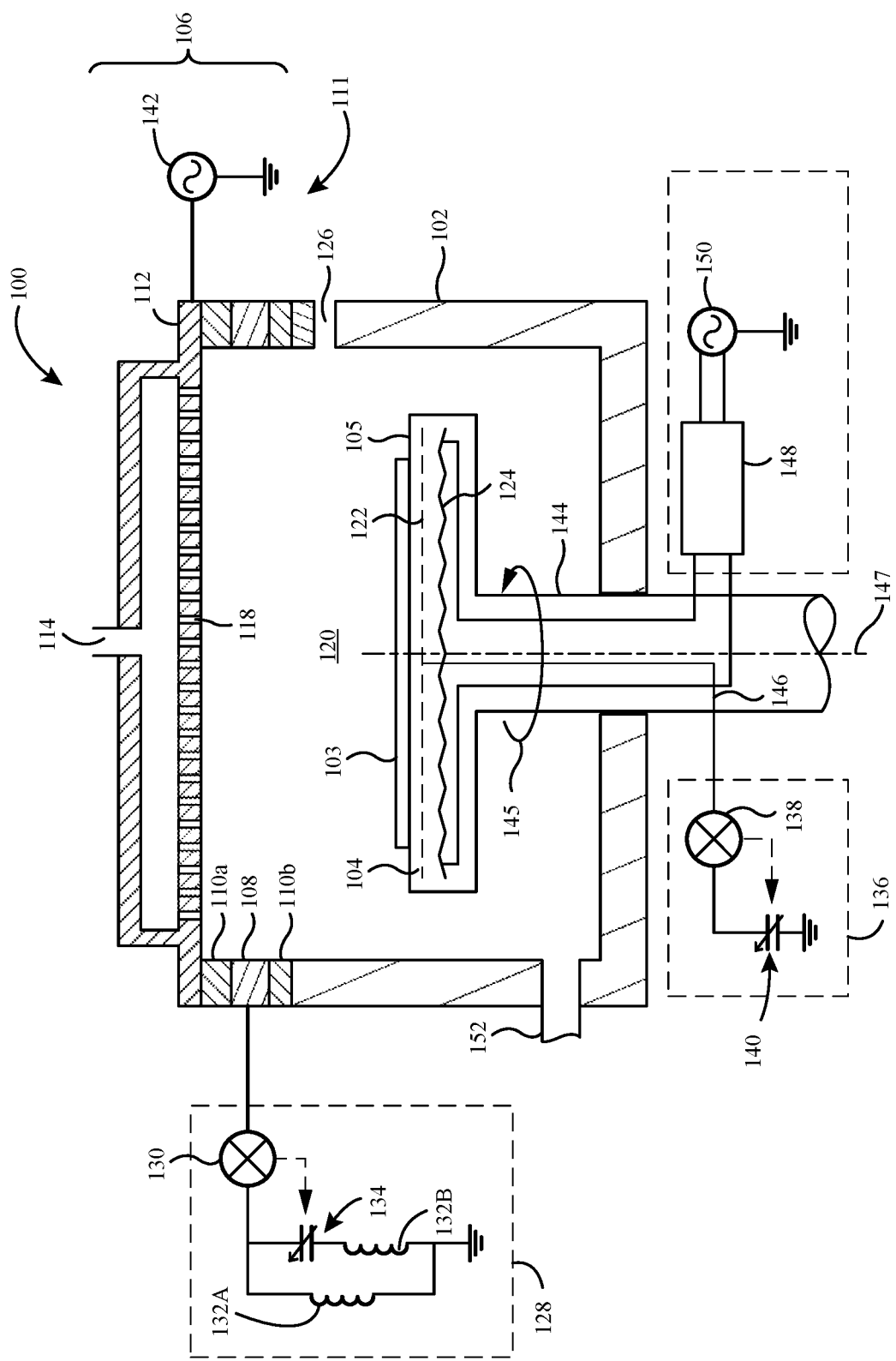
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size in order to scale devices. As structures are brought closer together within a device, maintaining uniformity across structures may be more difficult. Current processing may be incapable of producing films across reduced critical dimensions of structures with sufficient uniformity or other material characteristics. For example, films that may be characterized by higher line edge roughness and line width roughness due to formation may affect subsequent operations utilizing reduced line spacing. Although some conventional technologies may tune materials and concentrations within the films, these adjustments may also alter film characteristics, which may cause stress deformations during subsequent processing, or other detrimental effects.

The present technology overcomes these issues by performing a thermally-based material deposition, which may not utilize plasma generation during the deposition process. Additionally, the present technology may utilize one or more catalytic precursors during the formation, which may improve film characteristics in the produced materials. By performing a thermal reaction between specific carbon-containing precursors and silicon-containing precursors, the present technology may allow lower-temperature chemical-vapor deposition to be performed, which may provide conformal growth on any number of semiconductor structures. The process performed may allow increased tuning of the films being produced, affording films characterized by a variety of material properties for different applications.

Although the remaining disclosure will routinely identify specific deposition processes utilizing the disclosed technology, and will describe one type of semiconductor processing chamber, it will be readily understood that the processes described may be performed in any number of semiconductor processing chambers, as well as for any number of processing operations in which films as described may be incorporated. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as illustrated, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
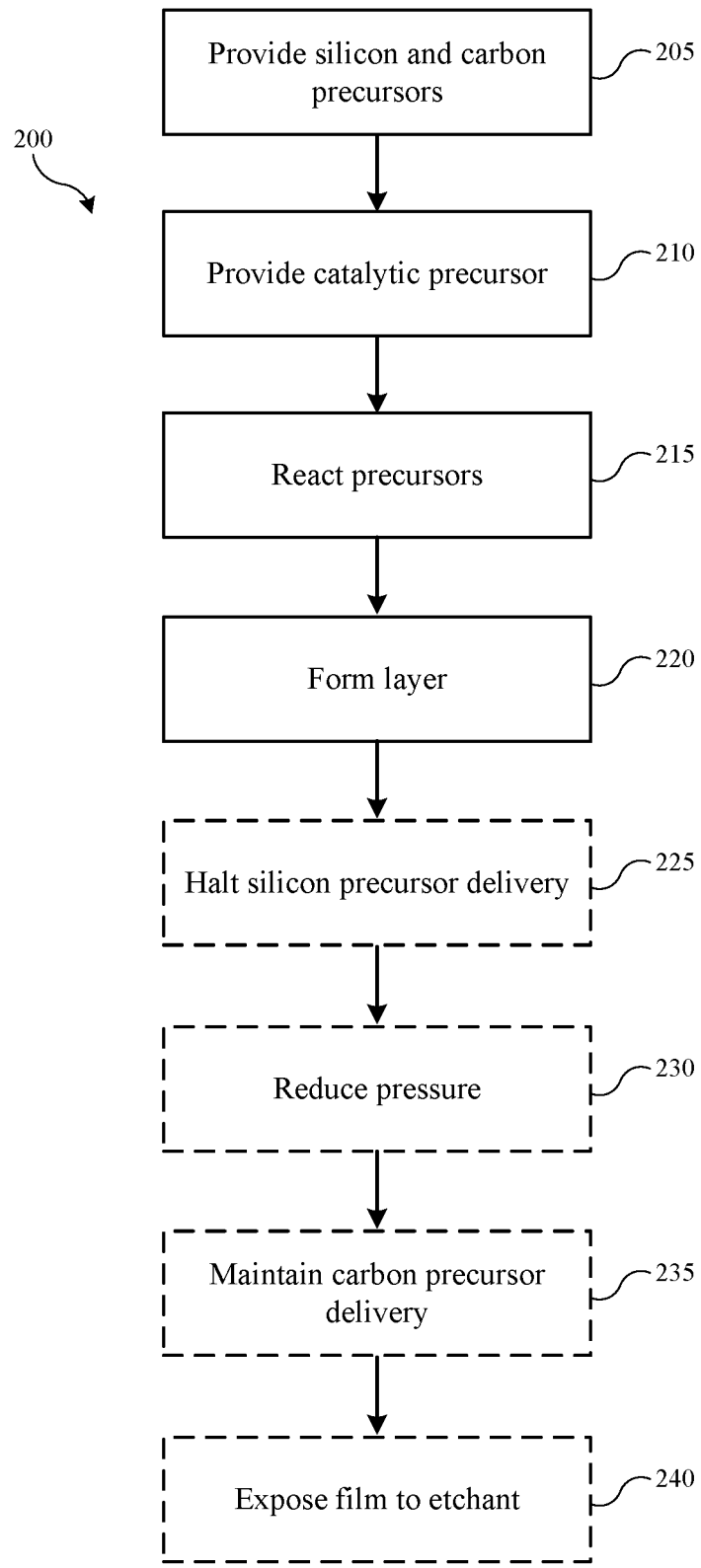
FIG. 2 shows operations in a semiconductor processing method according to some embodiments of the present technology.

As discussed previously, although a plasma-processing chamber may be used for one or more aspects of film processing according to the present technology, in some embodiments, forming silicon and carbon films may not utilize a plasma-enhanced process. Utilizing plasma may limit conformality of the film produced by further releasing carbon from precursors, and which may limit carbon incorporation in the films produced by allowing the carbon to recombine with other radical species and flow from the chamber. The present technology may at least form the film without plasma generation in some embodiments. FIG. 2 shows exemplary operations in a processing method 200 according to some embodiments of the present technology. The method may be performed in a variety of processing chambers, including processing chamber 100 described above, as well as any other chambers including non-plasma chambers, in which the operations may be performed. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may include a processing method that may include a number of operations for developing a silicon-and-carbon-containing film, which may include a tunable ratio of carbon within the film. As will be explained further below, modifying the ratios of silicon, a catalytic precursor, and carbon, as well as how the materials integrate within the film, may provide a number of properties to facilitate device processing for a number of structures.

At operation 205, the method may include providing a silicon-containing precursor and a carbon-containing precursor to the processing region of a semiconductor processing chamber where a substrate may be housed. At operation 210, which may occur simultaneously with operation 205, as well as prior to or subsequent operation 205, a boron-containing precursor or a catalytic precursor may be provided to the processing region of the semiconductor processing chamber. At operation 215, the silicon-containing precursor, the catalytic precursor, and the carbon-containing precursor may be thermally reacted within the processing region of the semiconductor processing chamber, which may form a silicon-and-carbon-containing layer on the substrate at operation 220. Because of the reaction being performed in some embodiments, the semiconductor processing chamber, the pedestal, or the substrate may be maintained at a temperature greater than or about 250° C., and in some embodiments may be maintained at a temperature that is greater than or about 300° C., greater than or about 320° C., greater than or about 340° C., greater than or about 360° C., greater than or about 380° C., greater than or about 400° C., greater than or about 420° C., greater than or about 440° C., greater than or about 460° C., greater than or about 480° C., greater than or about 500° C., greater than or about 520° C., greater than or about 540° C., greater than or about 560° C., greater than or about 580° C., greater than or about 600° C., or more.

As previously discussed, some or all of the formation operations may be performed while the substrate processing region is maintained plasma-free. By performing a thermal chemical-vapor deposition, a more conformal material formation may be produced, as well as a material characterized by increased carbon incorporation. Non-limiting examples of silicon-containing precursors that may be used during processing according to some embodiments of the present technology may include silane, disilane, silicon tetrafluoride, silicon tetrachloride, dichlorosilane, tetraethyl orthosilicate, as well as any other silicon-containing precursors that may be used in silicon-containing film formation. Many hydrocarbon precursors are characterized by high pyrolysis temperatures causing challenges with thermal deposition of carbon-containing materials. The present technology may utilize precursors facilitating a catalytic reaction between the boron precursor, or other catalytic precursor, and the carbon precursor, affording deposition operations performed at lower temperatures. Although any number of boron-containing precursors and carbon-containing precursors may be used, in some embodiments the precursors may be selected to facilitate the catalytic reaction. For example, in some embodiments the boron-containing precursor may be a boron-and-hydrogen-containing precursor, such as hydrides of boron, which may include or consist of boron and hydrogen, and may be characterized by the formula $B_xH_y$, where x and y may be any number. Exemplary boron-containing precursors may include borane, diborane, tetraborane, pentaborane, hexaborane, decaborane, or any other boron-containing precursors.

The carbon-containing precursor may be or include any number of carbon-containing precursors. For example, the carbon-containing precursor may be or include any hydrocarbon, or any material including or consisting of carbon and hydrogen. In some embodiments, to facilitate the reaction between the carbon precursor and the silicon or oxygen precursor, the carbon-containing precursor may be characterized by one or more carbon-carbon double bonds and/or one or more carbon-carbon triple bonds. Accordingly, in some embodiments the carbon-containing precursor may be or include an alkene or an alkyne, such as acetylene, ethylene, propene, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding.

A number of factors may impact the silicon, boron, and carbon concentration within the films. For example, in some embodiments, the produced film may be limited to or consist essentially of silicon, oxygen, carbon, and hydrogen, along with any trace materials, which may account for contaminants, for example. In some embodiments, the silicon concentration within the film may be maintained at less than or about 40%, which may help limit increased compressive stress within the film. Typically, as a silicon-containing precursor flow rate increases, deposition rate of a silicon-containing film may increase. This may often form a more tensile film characterized by looser association between the materials. However, the stress may be of a relative tensile nature, such as compared to a boron-containing film, which may have an increased tensile nature due to the three bonding sites available. Accordingly, for materials according to the present technology, as silicon incorporation or flow rate increases, the material produced may actually become more compressive than with lower silicon incorporation. This may affect certain structures being produced. For example, in some embodiments the present technology may be utilized to produce a spacer structure by doubling lines after formation and etching over a mandrel structure. Once the mandrel structure is removed, a compressive spacer film may deform or be characterized by increased roughness. However, if the film stress is more tensile, such as where the remaining layers may be characterized by a stress away from the mandrel, the mandrel removal may occur more readily, and improved spacer structures and lower roughness may be produced.

Accordingly, in some embodiments the produced material before or after an anneal may be characterized by a silicon concentration of less than or about 38%, and may be maintained at less than or about 36%, less than or about 34%, less than or about 32%, less than or about 30%, less than or about 28%, less than or about 26%, less than or about 24%, less than or about 22%, less than or about 20%, less than or about 18%, less than or about 16%, less than or about 15%, less than or about 14%, less than or about 13%, less than or about 12%, less than or about 11%, less than or about 10%, less than or about 9%, less than or about 8%, or less. The boron concentration within the film may be maintained below or about 20%, which may indicate the amount carbon and silicon that remain in the film, where a lower boron content may indicate more carbon concentration may be retained. Accordingly, in some embodiments the produced material before or after an anneal may be characterized by a boron concentration of less than or about 15%, and may be maintained at less than or about 12%, less than or about 10%, less than or about 9%, less than or about 8%, less than or about 7%, less than or about 6%, less than or about 5%, less than or about 4%, less than or about 3%, less than or about 2%, less than or about 1%, or less.

A number of factors may impact the carbon and boron concentration within the films. The carbon concentration may be greater than or about 5%, and may be greater than or about 10%, greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, greater than or about 80%, greater than or about 85%, greater than or about 90%, or more. In some embodiments, the flow rate of carbon may afford a carbon concentration up to a threshold, such as less than or about 50%. For example, the thermal reaction may proceed based on dissociation of the silicon-containing precursor, the radical effluents of which may facilitate dissociation of carbon-containing materials. However, formation of silicon-silicon bonds may compete with formation of silicon-carbon bonds, and thus the amount of carbon incorporation may be limited to a threshold of about 50% or less depending on the carbon-containing precursor. Additionally, carbon-containing precursors including a carbon-carbon triple bond may be more readily dissociated than carbon-containing precursors only including one or more carbon-carbon double bonds. Accordingly, increasing a flow rate of a carbon-containing precursor including one or more double bonds may be limited to producing a carbon incorporation of less than or about 35%, while increasing a flow rate of a carbon-containing precursor including one or more triple bonds may afford carbon incorporation up to a threshold of less than or about 50%.

However, the present technology may further increase the carbon concentration in produced films by utilizing a catalytic precursor with the silicon-containing precursor and the carbon-containing precursor. Although any number of catalytic precursors may be used, in some embodiments the catalytic precursor may be or include a boron-containing precursor. Without intending to be bound to any particular theory or reaction mechanism, including the boron-containing precursor may facilitate lowering the reaction temperature and may further assist in dissociating carbon-containing precursors. This may increase the amount of carbon radical species available for the deposition, and which may allow the carbon concentration to be higher compared to conventional technologies, and allow carbon concentration of up to 90% or more in some embodiments. Accordingly, in some embodiments a ratio of carbon atomic incorporation to silicon atomic incorporation may be greater than or about 1:1, and may be greater than or about 1.5:1, greater than or about 2.0:1, greater than or about 2.5:1, greater than or about 3.0:1, greater than or about 3.5:1, greater than or about 4.0:1, greater than or about 5.0:1, greater than or about 6.0:1, greater than or about 7.0:1, greater than or about 8.0:1, greater than or about 9.0:1, greater than or about 10.0:1, or more.

Additionally, the carbon precursor used may impact stress characteristics of the film produced. While a precursor characterized by a carbon-carbon triple bond may facilitate increased carbon incorporation, the precursor may also reduce a tensile stress of the film produced, which may impact utility in certain structures as previously noted. Accordingly, in some embodiments multiple carbon precursors may be used, which may include any combination of precursors having carbon-carbon triple bonds and/or carbon-carbon double bonds. This may allow increased film tuning, where precursors having carbon-carbon triple bonds may allow increasing carbon concentration of the film produced, while precursors having carbon-carbon double bonds may allow increasing tensile stress of the film produced. Accordingly, films produced may be characterized by a tensile film stress of greater than or about 50 MPa, and may be characterized by a tensile film stress of greater than or about 100 MPa, greater than or about 150 MPa, greater than or about 200 MPa, greater than or about 250 MPa, greater than or about 300 MPa, greater than or about 350 MPa, or higher.

Hydrogen incorporation in the film may impact one or more material properties, as well as the quality of the film produced. Although the carbon-containing precursor and/or the silicon-containing precursor may include hydrogen, in some embodiments no additional source of hydrogen may be provided. Although inert precursors or carrier gases may be provided with the silicon-containing precursor and the carbon-containing precursor, no other chemically reactive precursors may be delivered with the precursors in some embodiments. By limiting the hydrogen provided to the chamber to hydrogen included in the carbon-containing precursor and the silicon-containing precursor, an atomic ratio of hydrogen within the produced film may be lower than if hydrogen gas were additionally provided.

Film roughness may also be affected by the composition of the film, where the carbon-containing precursor may increase roughness. For example, longer chain hydrocarbons may contribute to increased film roughness in some embodiments. Roughness may be affected by a film thickness produced, and in some embodiments roughness characteristics noted below may be attributable to any film thickness including deposited thickness of less than or about 50 nm, less than or about 20 nm, less than or about 10 nm, less than or about 5 nm, or less. For example, a root-mean-square roughness of deposited films may be less than or about 1.000 nm, and may be less than or about 0.750 nm, less than or about 0.600 nm, less than or about 0.500 nm, less than or about 0.450 nm, less than or about 0.400 nm, less than or about 0.350 nm, less than or about 0.300 nm, less than or about 0.250 nm, less than or about 0.200 nm, or less.

To produce films characterized by increased carbon incorporation, while controlling the boron concentration within the film, the present technology may deliver the precursors to control atomic incorporation, and facilitate bonding between silicon and carbon. For example, boron and carbon readily bond and form within a film during many processing operations. Accordingly, boron incorporation in carbon and boron films may normally exceed 50% or more even at minimal flow rates of less. However, in embodiments of the present technology, boron concentration may be minimized as the boron operates as a catalyst for carbon and silicon incorporation within the film, and where the boron is characterized by reduced incorporation. Additionally, flow rates of the silicon-containing and the boron-containing precursor may be maintained low to ensure increased incorporation of carbon materials. For example, in some embodiments, a flow rate of the silicon-containing precursor may be maintained at less than or about 250 sccm, and may be maintained at less than or about 200 sccm, less than or about 150 sccm, less than or about 100 sccm, less than or about 90 sccm, less than or about 80 sccm, less than or about 70 sccm, less than or about 60 sccm, less than or about 50 sccm, less than or about 40 sccm, less than or about 30 sccm, less than or about 20 sccm, less than or about 10 sccm, or less. By maintaining the silicon-containing precursor flow rate sufficiently low, silicon incorporation may be controlled while allowing the silicon radicals to facilitate carbon material dissociation.

Similarly, maintaining a lower boron-containing precursor flow rate may control boron incorporation, which may facilitate a catalytic interaction and, instead of incorporating boron in high percentages similar to conventional technologies even at low flow rates, boron incorporation may be limited to percentages as discussed above. Hence, in some embodiments of the present technology the flow rate of the boron-containing precursor may be maintained at less than or about 50 sccm, and may be maintained at less than or about 40 sccm, less than or about 30 sccm, less than or about 20 sccm, less than or about 10 sccm, less than or about 5 sccm, less than or about 4 sccm, less than or about 3 sccm, less than or about 2 sccm, less than or about 1 sccm, or less. The carbon-containing precursor may be flowed at higher flow rates, which may ensure sufficient carbon is available for interaction with silicon radical species, and which may increase silicon-carbon bonding, while reducing silicon-silicon bonding. Accordingly, in some embodiments the flow rate of the carbon-containing precursor may be maintained at greater than or about 500 sccm, and may be maintained at greater than or about 750 sccm, greater than or about 1000 sccm, greater than or about 1250 sccm, greater than or about 1500 sccm, greater than or about 1750 sccm, greater than or about 2000 sccm, greater than or about 2250 sccm, greater than or about 2500 sccm, or more.

Providing the precursors at certain ratios to one another may also facilitate control of the film formation to produce the properties and characteristics previously described. For example, in some embodiments the flow rate of the carbon-containing precursor may be maintained higher than the silicon-containing precursor, which may help increase carbon incorporation within the film. Hence, in some embodiments the flow rate ratio of the carbon-containing precursor to the silicon-containing precursor may be maintained at greater than or about 1:1, and may be maintained at greater than or about 2:1, greater than or about 4:1, greater than or about 6:1, greater than or about 8:1, greater than or about 10:1, greater than or about 12:1, greater than or about 14:1, greater than or about 16:1, greater than or about 18:1, greater than or about 20:1, greater than or about 25:1, greater than or about 30:1, greater than or about 35:1, greater than or about 40:1, greater than or about 45:1, greater than or about 50:1, or higher. Additionally, the flow rate of the boron-containing precursor may be maintained lower than either of the silicon-containing precursor or the carbon-containing precursor, which may facilitate operation as a catalyst, while limiting incorporation within the film. In some embodiments, a flow rate ratio of either of the other precursors compared to the boron-containing precursor may be maintained at greater than or about 10:1, and may be maintained at greater than or about 25:1, greater than or about 50:1, greater than or about 75:1, greater than or about 100:1, greater than or about 125:1, greater than or about 150:1, greater than or about 175:1, greater than or about 200:1, greater than or about 300:1, greater than or about 400:1, greater than or about 500:1, greater than or about 600:1, greater than or about 700:1, greater than or about 800:1, greater than or about 900:1, greater than or about 1000:1, or higher.

Development of silicon-and-carbon containing structures may be performed at any number of pressure regimes, such as greater than or about 10 Torr, greater than or about 12 Torr, greater than or about 15 Torr, greater than or about 20 Torr, greater than or about 50 Torr, greater than or about 100 Torr, greater than or about 150 Torr, greater than or about 200 Torr, greater than or about 250 Torr, greater than or about 300 Torr, or higher. After a sufficient film thickness has been produced, and while the substrate is still resident in the processing region of the semiconductor processing chamber, a purge operation may be performed by allowing the chamber to exhaust and reducing the pressure to increased vacuum conditions. Typically, processing will involve halting the delivery of all deposition precursors followed by a pressure reduction. Because embodiments of the present technology may be performed at relatively higher pressures as noted, exhausting the pressure below a few Torr of pressure may take an amount of time. Although carbon may readily exhaust from the processing region, silicon plasma effluents may remain in the processing region, which is often maintained at processing temperatures. Consequently, this may cause a silicon-rich cap to form on the produced film. Accordingly, in some embodiments of the present technology, method 200 may include processes to ensure a more uniform distribution throughout the film.

For example, in some embodiments, once sufficient film thickness has been deposited or formed, delivery of the silicon-containing precursor may be halted at optional operation 225. The pressure in the chamber may then be reduced at optional operation 230, such as by opening a throttle valve in an exhaust foreline structure, for example. Additionally, in some embodiments, a flow of one or more carbon-containing precursors may be at least partially maintained at optional operation 235 while the chamber is being pumped down or exhausted. For example, the flow rate of the carbon-containing precursor may be completely maintained, or may be maintained at a fraction of the flow rate, such as less than or about 75%, less than or about 50%, less than or about 25%, or less. Accordingly, remaining silicon radical effluents may be more likely to interact with carbon materials, and a final thickness of the produced film, such as less than or about 5%, less than or about 3%, less than or about 1%, or less, may be characterized by a similar or identical atomic structure as the film bulk.

Silicon-and-carbon materials produced by the present technology may be used in a number of structures, and may be a mask, liner, or spacer, for example, which may be removed after subsequent processing has been performed. Based on the configuration of the materials produced, in some embodiments the film may be removed without the need for halogen-containing plasmas, which may impact etch selectivity with respect to underlying materials, and in some embodiments plasma removal may not be needed at all. For example, in some embodiments after formation of the silicon-and-carbon material and subsequent material processing, the silicon-and-carbon material may be exposed to one or more etchants in optional operation 240. In some embodiments, an in situ plasma may be formed of a hydrogen-containing or oxygen-containing precursor within the processing region of the chamber, such as utilizing oxygen, water, or any other oxygen-containing material, which may provide ashing of the silicon-and-carbon materials while maintaining or substantially maintaining the underlying materials.

Additionally, when the film is included in a structure where a selective removal of a separate material may be performed, such as of an amorphous carbon film, for example, the film may be at least partially maintained. For example, because of the silicon incorporation in the film, such as in comparison to a material limited to boron and carbon, exposure to oxygen may produce a layer of silicon oxide, which may resist further removal from an oxygen plasma. Accordingly, in some embodiments while the silicon-and-carbon-containing layer may be at least partially etched, the material may not be fully removed due to the formation of silicon oxide. Additionally, in some embodiments, a wet etch may be performed to remove some or all aspects of the film, including a residual silicon oxide layer. For example, an oxidizing material may be applied to the silicon-and-carbon material, which may remove the materials in some embodiments, and a subsequent acid etch or dry selective etch may be performed to remove the silicon oxide that may remain. When carbon incorporation is above a threshold, such as greater than or about 30%, greater than or about 35%, greater than or about 40%, or higher, a hydroxide solution, such as may be mixed with an acid, such as sulfuric acid, may be applied to the substrate, which may at least partially remove the silicon-and-carbon materials in some embodiments.

Figure 3:
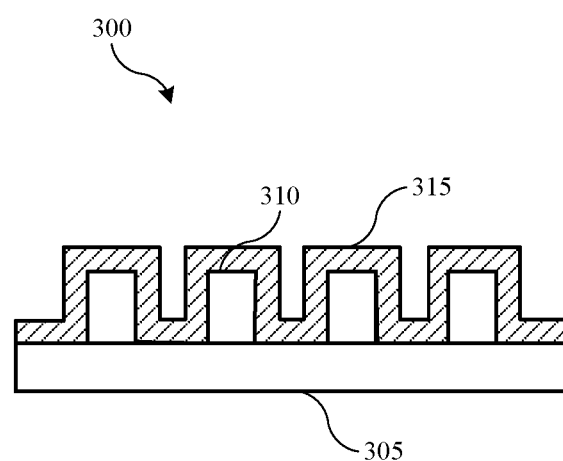
FIG. 3 shows an exemplary material layer produced according to some embodiments of the present technology.

As explained previously, in some embodiments the thermally based material formation may provide more conformal films, which may operate as a liner, spacer, or other material used during semiconductor processing. FIG. 3 shows an exemplary deposition produced according to some embodiments of the present technology. For example, a substrate 305 may have a material 310 formed, or may have a number of features formed through the substrate, which may produce a structure, such as a line structure in some embodiments. In some embodiments of the present technology, a silicon-and-carbon film 315 may be formed over the structure as illustrated. It is to be understood that this example is not intended to be limiting, as the present technology may be utilized in any number of processing operations. Formation of the film may occur based on methods or operations previously described.

The aspect ratio of the features, or a width between formed features may be constrained in some embodiments. A plasma-deposited layer may be incapable of accessing deeper within the trench, and pinch off may occur at the top of the feature. However, silicon-and-carbon films produced by the present technology may be characterized by coverage fully through the structure as illustrated. For example, a thickness of the film along sidewalls nearer the top of the structure and a thickness of the film along sidewalls nearer the bottom of the structure may be substantially the same, where the film produced is substantially conformal. Accordingly, in some embodiments the film deposited may be characterized by a conformality or a similarity of thickness formed between any two regions including a region across the top of a feature, along a sidewall, and/or at a base between features, as well as anywhere along the film formed, of greater than or about 80%. In some embodiments, the conformality may be greater than or about 85%, greater than or about 90%, greater than or about 92%, greater than or about 94%, greater than or about 96%, greater than or about 98%, or higher. Accordingly, the present technology may produce silicon-and-carbon containing films characterized by a controlled stress and an increased carbon incorporation compared to conventionally developed films.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor and a carbon-containing precursor to a processing region of a semiconductor processing chamber, wherein the carbon-containing precursor is characterized by a carbon-carbon double bond or a carbon-carbon triple bond, and wherein a substrate is disposed within the processing region of the semiconductor processing chamber;
providing a boron-containing precursor to the processing region of the semiconductor processing chamber;
thermally reacting the silicon-containing precursor, the carbon-containing precursor, and the boron-containing precursor at a temperature above about 250° C.;
forming a silicon-and-carbon-containing layer on the substrate, wherein the processing region of the semiconductor processing chamber is maintained plasma-free while forming the silicon-and-carbon-containing layer on the substrate;
halting delivery of the silicon-containing precursor; and
maintaining delivery of the carbon-containing precursor while reducing a pressure within the semiconductor processing chamber.

2. The semiconductor processing method of claim 1, wherein a boron concentration within the film is maintained at less than or about 20 at. %.

3. The semiconductor processing method of claim 1, wherein the substrate is characterized by one or more features, and wherein the silicon-and-carbon-containing layer is formed about the one or more features with a conformality of greater than or about 90%.

4. The semiconductor processing method of claim 1, wherein thermally reacting the silicon-containing precursor, the carbon-containing precursor, and the boron-containing precursor is performed at a temperature greater than or about 400° C.

5. The semiconductor processing method of claim 1, wherein the silicon-and-carbon-containing layer is characterized by a carbon concentration of greater than or about 30 at. %, and wherein the silicon-and-carbon-containing layer is characterized by a silicon concentration of less than or about 50 at. %.

6. The semiconductor processing method of claim 5, wherein a ratio of carbon incorporation to silicon incorporation is maintained at greater than or about 3:1.

7. The semiconductor processing method of claim 1, wherein the carbon-containing precursor is provided at a flow rate ratio to the silicon-containing precursor of greater than or about 10:1.

8. The semiconductor processing method of claim 1, further comprising:
exposing the silicon-and-carbon-containing layer to an oxygen-containing plasma; and
at least partially etching the silicon-and-carbon-containing layer.

9. The semiconductor processing method of claim 1, wherein the carbon-containing precursor is provided at a flow rate ratio to the silicon-containing precursor of greater than or about 20:1.

10. A semiconductor processing method comprising:
providing a silicon-containing precursor and a carbon-containing precursor to a processing region of a semiconductor processing chamber, wherein the carbon-containing precursor is provided at a flow rate ratio to the silicon-containing precursor of greater than or about 10:1, and wherein a substrate is disposed within the processing region of the semiconductor processing chamber;
providing a boron-containing precursor to the processing region of the semiconductor processing chamber;
thermally reacting the silicon-containing precursor, the carbon-containing precursor, and the boron-containing precursor at a temperature greater than or about 400° C.;
forming a silicon-and-carbon-containing layer on the substrate;
halting delivery of the silicon-containing precursor;
reducing a pressure within the semiconductor processing chamber; and
maintaining delivery of the first carbon-containing precursor while reducing the pressure within the semiconductor processing chamber.

11. The semiconductor processing method of claim 10, wherein the processing region of the semiconductor processing chamber is maintained plasma-free during the semiconductor processing method.

12. The semiconductor processing method of claim 10, wherein a pressure within the semiconductor processing chamber is maintained at greater than or about 12 Torr while forming the silicon-and-carbon-containing layer.

13. The semiconductor processing method of claim 10, wherein the silicon-and-carbon-containing layer is characterized by an average roughness of less than or about 0.5 nm, and wherein the silicon-and-carbon-containing layer is characterized by a positive stress.

14. The semiconductor processing method of claim 10, wherein the silicon-and-carbon-containing layer is characterized by a carbon concentration of greater than or about 50 at. %, and wherein the silicon-and-carbon-containing layer is characterized by a silicon concentration of less than or about 20 at. %, and wherein the silicon-and-carbon-containing layer is characterized by a boron concentration of less than or about 10 at. %.

15. A semiconductor processing method comprising:
providing a silicon-containing precursor, a first carbon-containing precursor, and a second carbon-containing precursor to a processing region of a semiconductor processing chamber, wherein a substrate is disposed within the processing region of the semiconductor processing chamber;
providing a catalytic precursor to the processing region of the semiconductor processing chamber;
thermally reacting the silicon-containing precursor, the first carbon-containing precursor, the second carbon-containing precursor, and the catalytic precursor at a temperature greater than or about 300° C.;
forming a silicon-and-carbon-containing layer on the substrate, wherein the processing region of the semiconductor processing chamber is maintained plasma-free while forming the silicon-and-carbon-containing layer on the substrate;
halting delivery of the silicon-containing precursor;
reducing a pressure within the semiconductor processing chamber; and
maintaining delivery of the first carbon-containing precursor and the second carbon-containing precursor while reducing the pressure within the semiconductor processing chamber.

* * * * *